(12) United States Patent
Huang

(10) Patent No.: US 10,859,884 B2
(45) Date of Patent: Dec. 8, 2020

(54) LIQUID CRYSTAL DISPLAY PANEL AND LIQUID CRYSTAL DISPLAY APPARATUS

(71) Applicant: HKC Corporation Limited, Guangdong (CN)

(72) Inventor: Beizhou Huang, Guangdong (CN)

(73) Assignee: HKC Corporation Limited, Shenzhen (CN)

( * ) Notice: Subject to any disclaimer, the term of this patent is extended or adjusted under 35 U.S.C. 154(b) by 39 days.

(21) Appl. No.: 16/241,982

(22) Filed: Jan. 7, 2019

(65) Prior Publication Data

US 2020/0089065 A1 Mar. 19, 2020

Related U.S. Application Data

(63) Continuation of application No. PCT/CN2018/111324, filed on Oct. 23, 2018.

(30) Foreign Application Priority Data

Sep. 13, 2018 (CN) .......................... 2018 1 1072779

(51) Int. Cl.
*G02F 1/1362* (2006.01)
*H01L 27/12* (2006.01)

(52) U.S. Cl.
CPC .. *G02F 1/136259* (2013.01); *G02F 1/136286* (2013.01); *G02F 2001/136263* (2013.01); *G02F 2001/136295* (2013.01); *H01L 27/124* (2013.01)

(58) Field of Classification Search
CPC ... G02F 1/136259; G02F 2001/136263; G02F 2001/136272; G02F 1/136286; H01L 27/124
See application file for complete search history.

(56) References Cited

U.S. PATENT DOCUMENTS

| | | | |
|---|---|---|---|
| 6,429,908 B1* | 8/2002 | Lim | G02F 1/1309 349/54 |
| 7,609,246 B2* | 10/2009 | Hsu | G09G 3/3611 345/93 |
| 10,159,145 B2* | 12/2018 | Nakaminami | G09F 9/00 |
| 2003/0103045 A1* | 6/2003 | Shiraishi | G02F 1/13452 345/204 |
| 2005/0195338 A1* | 9/2005 | Matsumoto | G02F 1/136204 349/40 |
| 2007/0040794 A1* | 2/2007 | Kwak | G02F 1/136259 345/100 |
| 2008/0018636 A1* | 1/2008 | Chang | G09G 3/3685 345/211 |
| 2010/0177270 A1* | 7/2010 | Nakagawa | G02F 1/1345 349/141 |

(Continued)

FOREIGN PATENT DOCUMENTS

CN 1967364 A 5/2007
CN 101592797 A 12/2009
(Continued)

*Primary Examiner* — Jia X Pan

(57) ABSTRACT

The present application discloses a liquid crystal display panel and a liquid crystal display device, wherein the liquid crystal display panel comprises an array substrate, a sealed plastic frame, and a repair line including a connecting line located on a side of the sealed plastic frame facing away from the display region.

16 Claims, 2 Drawing Sheets

(56) References Cited

U.S. PATENT DOCUMENTS

| | | | | |
|---|---|---|---|---|
| 2011/0134089 A1* | 6/2011 | Ozeki | .................... | G09G 3/006 |
| | | | | 345/205 |
| 2012/0050658 A1* | 3/2012 | Cheng | ............... | G02F 1/136259 |
| | | | | 349/139 |
| 2013/0235279 A1* | 9/2013 | Sugisaka | ............... | G02F 1/1345 |
| | | | | 348/739 |
| 2015/0316802 A1* | 11/2015 | Takanishi | ............ | H01L 27/1244 |
| | | | | 349/43 |
| 2015/0348480 A1 | 12/2015 | Ishibashi et al. | | |
| 2019/0324334 A1* | 10/2019 | Fang | .................. | G02F 1/13454 |

FOREIGN PATENT DOCUMENTS

| | | |
|---|---|---|
| CN | 101950110 A | 1/2011 |
| CN | 102289119 A | 12/2011 |
| CN | 103034008 A | 4/2013 |
| CN | 107544187 A | 1/2018 |
| JP | H0442215 A | 2/1992 |
| JP | 2010164727 A | 7/2010 |

* cited by examiner

LIQUID CRYSTAL DISPLAY PANEL AND LIQUID CRYSTAL DISPLAY APPARATUS

CROSS REFERENCE TO RELATED APPLICATIONS

The present application is a Continuation Application of PCT Application No. PCT/CN2018/111324 filed on Oct. 23, 2018, which claims the benefit of Chinese Patent Application No. 201811072779.2 filed on Sep. 13, 2018. All the above are hereby incorporated by reference.

FIELD OF THE DISCLOSURE

The present application relates to the field of liquid crystal display technologies, and in particular, to a liquid crystal display panel and a liquid crystal display apparatus.

BACKGROUND OF THE DISCLOSURE

The liquid crystal display device has many advantages such as thin body, power saving, no radiation, etc., and gradually becomes the mainstream of the display, and is widely used in mobile phones, notebook computers, flat-panel TVs and the like. Most of the liquid crystal display devices on the market are backlight-type liquid crystal display devices, which include a liquid crystal display panel and a backlight module. Generally, the liquid crystal display panel is composed of a color film substrate, a thin film transistor array substrate, a liquid crystal sandwiched between the color film substrate and the thin film transistor array substrate, and a sealed plastic frame.

A scan line for scanning signals, a data line for providing a data signal, and a pixel region defined by the scan line and the data line are formed on the thin film transistor array substrate, and a thin film transistor and a pixel electrode are disposed in the pixel region. The magnitude of the voltage on the pixel electrode and the on-off are controlled by a gate connected to the horizontal scan line and a source connected to the vertical data line.

At present, liquid crystal displays are aiming at developing those with high resolution, high definition, etc. Accordingly, in order to meet high resolution requirements, the device structure is more and more fine, and the wiring is narrower and narrower. Due to the process, the data line or the scan line may be broken, causing pixels to form bright spots or dark spot defects. So it is common practice to design a repair line that is connected to both ends of the data line or scan line where the break occurs to allow the electrical signal to still conduct normally.

Taking the repair of the data line as an example, the current repair line mainly includes two lead lines which are respectively in insulated connection with the two ends of the data line, and a connecting line connecting the two lead lines. The design of the lead line is similar, as long as the insulating layer can be blown during repair, and the data line is turned on. For the design of the connecting line, the two methods of FIGS. 1 and 2 are mainly used: referring to FIG. 1, the connecting line 43 is disposed on the inner side of the sealed plastic frame 3, and according to the parallel capacitance formula, repair line loading=ε0 εrA/d (where ε0 is the dielectric constant in vacuum, ε0=1, εr is the dielectric constant of the LC material, εr=3.5~7), so that an excessive loading on the connection line will be undoubtedly caused, and under high-resolution products, the problem of insufficient charging rate is likely to occur; referring to FIG. 2, the connecting line 43 is disposed at the bottom of the sealed plastic frame 3, and it is to be understood that the sealed plastic frame 3 requires to be cured by backlighting, therefore, the connecting line 43 located at the bottom of the sealed plastic frame 3 must have a plurality of notches 433 for the light to pass through the sealed plastic frame 3 for curing, but the connecting line 43 after the slotting is too thin, resulting in an increase in its impedance; therefore, it is necessary to increase the width of the wiring of the entire connecting line 43, and thus, it is easy to conflict with the requirements for the narrow frame of the liquid crystal display panel.

In summary, based on the requirements of the high resolution and narrow frame for liquid crystal display products, no suitable design methods for repair line have been found.

SUMMARY OF THE DISCLOSURE

The main purpose of the present application is to provide a liquid crystal display panel, which aims to solve the technical problem that the design of the repair line in the liquid crystal display panel cannot meet the high resolution and narrow frame requirements of the product at the same time. The main purpose of the present application is to provide a liquid crystal display panel, which aims to solve the technical problem that the design of the repair line in the liquid crystal display panel may not meet the requirements of high resolution and narrow frame for the product at the same time.

To achieve the above purpose, the liquid crystal display panel proposed by the present application comprises:

an array substrate having first and second ends disposed opposite to each other in a vertical direction; the first end is provided with a plurality of package bodies in a lateral direction, and a plurality of data lines extending in a vertical direction is led out of each of the package bodies;

a sealed plastic frame disposed around the display region on the array substrate;

and a repair line including a lead-out line, lead-in line, and a connecting line; the lead-out line is in insulated connection with one end of the at least one of the data lines adjacent to the package body, the lead-in line is in insulated connection with one end of the corresponding data line away from the package body, and both ends of the connecting line are each electrically connected to the lead-out line and the lead-in line; wherein, the connecting line is located on a side of the sealed plastic frame facing away from the display region.

Optionally, the connecting line is disposed flush with a side of the sealed plastic frame facing away from the display region.

Optionally, the connecting line is disposed flush with an outer edge of the array substrate.

Optionally, the line width of the connecting line is 150 μm to 350 μm.

Optionally, the line width of the connecting line is 250 μm.

Optionally, the connecting line includes a vertical connecting line and a horizontal connecting line connected to each other, one end of the vertical connecting line away from the horizontal connecting line being electrically connected to the lead-out line and the horizontal connecting line being electrically connected to the lead-in line.

Optionally, the lead-out line passes through at least one of the package bodies from an end of the vertical connecting line away from the horizontal connecting line, and is in insulated connection with a corresponding data line.

Optionally, the horizontal connecting line includes a plurality of horizontal connecting sections spaced apart from each other, and the horizontal connecting sections are disposed in one-to-one correspondence with the package body; the lead-in line includes a plurality of lead-in sections spaced apart from each other, and the lead-in sections are correspondingly disposed with an interval between any two adjacent package bodies;

any two adjacent horizontal connecting sections are connected by one lead-in section.

Optionally, the position where the lead-out wire is in insulated connection with the data line is disposed near the outer edge of the display region.

Optionally, the position where the lead-in wire is in insulated connection with the data line is disposed near the outer edge of the display region.

Optionally, the liquid crystal display panel further comprises another repair line, and the connecting lines of two of the repair lines are respectively located on both sides of the display region in the lateral direction;

the first end is provided with two circuit boards in a lateral direction, a plurality of the package bodies are respectively disposed on the two circuit boards, the lead-out lines of two of the repair lines respectively pass through the respective package body on one of the circuit boards and are in insulated connection with one end of the corresponding data lines close to the package body, and the lead-in lines of two of the repair lines are respectively in insulated connection with one end of the corresponding data line away from the package body.

Optionally, the lead-out line, the lead-in line and the connecting line are all made of the same metal material; or the lead-out line and the lead-in line are made of a first metal material, and the connecting line is made of a second metal material.

Optionally, the first metal material is molybdenum or titanium, and the second metal material is aluminum.

The present application further provides a liquid crystal panel comprising:

an array substrate having first and second ends disposed opposite to each other in a vertical direction; the first end is provided with a plurality of package bodies in a lateral direction, and a plurality of data lines extending in a vertical direction is led out of each of the package bodies;

a sealed plastic frame disposed around the display region on the array substrate; and a repair line including a lead-out line, lead-in line, and a connecting line; the lead-out line is in insulated connection with one end of the at least one of the data lines adjacent to the package body, the lead-in line is in insulated connection with one end of the corresponding data line away from the package body, and both ends of the connecting line are each electrically connected to the lead-out line and the lead-in line; wherein, the connecting line is located on a side of the sealed plastic frame facing away from the display region;

one side of the connecting line is disposed flush with a side of the sealed plastic frame facing away from the display region, and the other side is disposed flush with the outer edge of the array substrate.

The present application further provides a liquid crystal display device, comprising a liquid crystal display panel including:

an array substrate having first and second ends disposed opposite to each other in a vertical direction; the first end is provided with a plurality of package bodies in a lateral direction, and a plurality of data lines extending in a vertical direction is led out of each of the package bodies;

a sealed plastic frame disposed around the display region on the array substrate; and a repair line including a lead-out line, lead-in line, and a connecting line; the lead-out line is in insulated connection with one end of the at least one of the data lines adjacent to the package body, the lead-in line is in insulated connection with one end of the corresponding data line away from the package body, and both ends of the connecting line are each electrically connected to the lead-out line and the lead-in line; wherein, the connecting line is located on a side of the sealed plastic frame facing away from the display region.

Optionally, the connecting line is disposed flush with a side of the sealed plastic frame facing away from the display region.

Optionally, the connecting line is disposed flush with an outer edge of the array substrate.

Optionally, the line width of the connecting line is 150 μm to 350 μm.

Optionally, the connecting line includes a vertical connecting line and a horizontal connecting line connected to each other, one end of the vertical connecting line away from the horizontal connecting line being electrically connected to the lead-out line and the horizontal connecting line being electrically connected to the lead-in line.

Optionally, the horizontal connecting line includes a plurality of horizontal connecting sections spaced apart from each other, and the horizontal connecting sections are disposed in one-to-one correspondence with the package body; the lead-in line includes a plurality of lead-in sections spaced apart from each other, and the lead-in sections are correspondingly disposed with an interval between any two adjacent package bodies;

any two adjacent horizontal connecting sections are connected by one lead-in section.

The repair line of the technical solution of the present application includes a lead-out line, a lead-in line, and a connecting line. The lead-out line and the lead-in line are respectively in insulated connection with the two ends of the data line, and the connecting line is used to connect the lead-out line and the lead-in line, so that the repair line becomes an alternative to the data line. Once the data line is disconnected, the technician only blows the insulated connection to turn on the connection between the repair line and the data line, thereby realizing the transmission of the signal through the repair line and maintaining the normal operation of the liquid crystal display panel. In addition, the technical solution of the present application emphasizes that the connecting line is disposed on a side of the sealed plastic frame facing away from the display region. In this way, on the one hand, the loading is avoided to be too large when the connecting line is disposed inside the sealed plastic frame, and on the other hand, the line width is avoided to be too large when the connecting line is disposed at the bottom of the sealed plastic frame, thereby meeting the requirements for high resolution and narrow frame of liquid crystal display products.

BRIEF DESCRIPTION OF THE DRAWINGS

In order to illustrate the technical schemes in the embodiments of the present application or in the prior art more clearly, the drawings which are required to be used in the description of the embodiments or the prior art are briefly described below. It is obvious that the drawings described below are only some embodiments of the present application. It is apparent to those of ordinary skill in the art that other drawings may be obtained based on the structures shown in accompanying drawings without inventive effort.

DESCRIPTION OF THE REFERENCE NUMERALS

Figure 1:
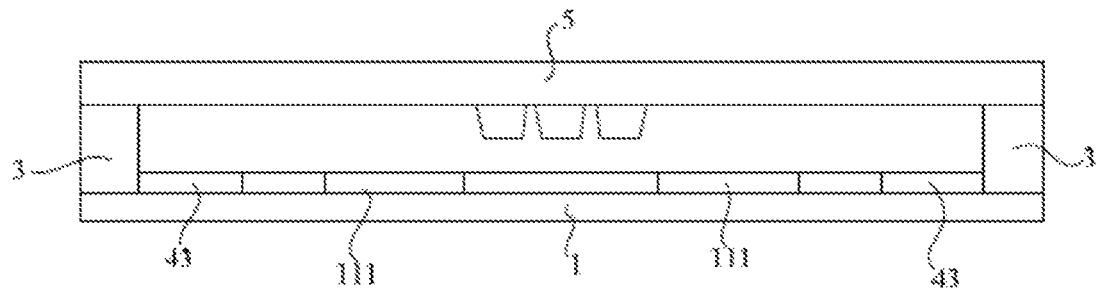
FIG. 1 is a cross-sectional view showing an embodiment of a liquid crystal display panel in an exemplary technique.
Figure 2:
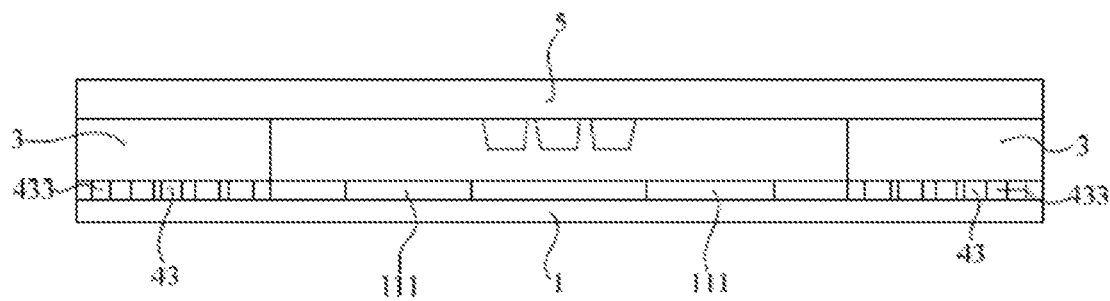
FIG. 2 is a cross-sectional view showing another embodiment of a liquid crystal display panel in an exemplary technique.

| Reference | Name | Reference | Name |
|---|---|---|---|
| 1 | array substrate | 11 | display region |
| 2 | circuit board | 21 | package body |
| 3 | sealed plastic frame | 4 | repair line |
| 41 | lead-out line | 42 | lead-in line |
| 421 | lead-in section | 43 | connecting line |
| 431 | vertical connecting line | 432 | horizontal connecting line |
| 432a | horizontal connecting section | 5 | color film substrate |

With reference to the drawings, the implement of the object, features and advantages of the present application will be further illustrated in conjunction with embodiments.

DETAILED DESCRIPTION OF THE EMBODIMENTS

The technical solutions in the embodiments of the present application will be clearly and completely described hereafter in connection with the drawings in embodiments of the present application. It is apparent that the described embodiments are only a part of the embodiments of the present application, but not the whole. Based on the embodiments of the present application, all the other embodiments obtained by those of ordinary skill in the art without inventive effort are within the scope of the present application.

It should be noted that, if there is a directional indication (such as up, down, left, right, front, back, . . . ) in the embodiments of the present application, the directional indication is only used to explain the relative positional relationship, the motion situation, etc. between the components in a certain posture (as shown in the drawings), and if the certain posture changes, the directional indication also changes accordingly.

In addition, if there is a description related to "first", "second", etc. in the embodiments of the present application, the description of the "first", "second", etc. is used for the purpose of description only, and is not to be construed as indicating or implying its relative importance or implicitly indicating the number of technical features indicated. Thus, features defined by "first" or "second" may include at least one of the features, either explicitly or implicitly. In addition, the technical solutions between the various embodiments may be combined with each other, but must be based on what can be implemented by those skilled in the art. When the combination of technical solutions is contradictory or impossible to achieve, it should be considered that the combination of such technical solutions does not exist and is not within the scope of protection claimed in the present application.

The present application provides a liquid crystal display panel for a liquid crystal display device. It should be noted that the liquid crystal display device may be a liquid crystal television, a liquid crystal display or the like, and the design is not limited thereto.

It is easy to understand that liquid crystal display products are aiming at developing those with high resolution, high definition, etc. Accordingly, in order to meet high resolution requirements, the device structure is more and more fine, and the wiring is narrower and narrower. Due to the process, the data line or the scan line may be broken, causing pixels to form bright spots or dark spot defects. So it is common practice in example technique to design a repair line that is connected to both ends of the data line or scan line where the break occurs to allow the electrical signal to still conduct normally. However, the two commonly used design methods for repair line either fail to meet the high resolution requirements of the product or fail to meet the narrow frame requirements of the product. Therefore, the present application has been correspondingly improved for the repair line design of the liquid crystal display panel.

Figure 3:
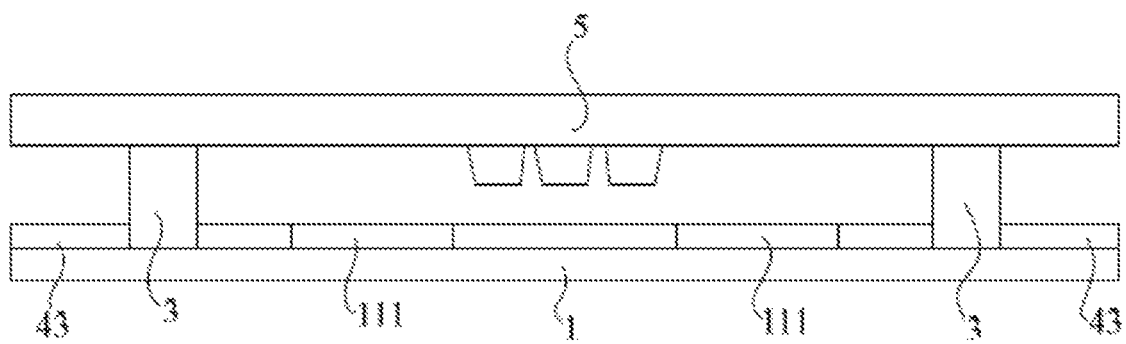
FIG. 3 is a cross-sectional view showing an embodiment of a liquid crystal display panel in the present application.
Figure 4:
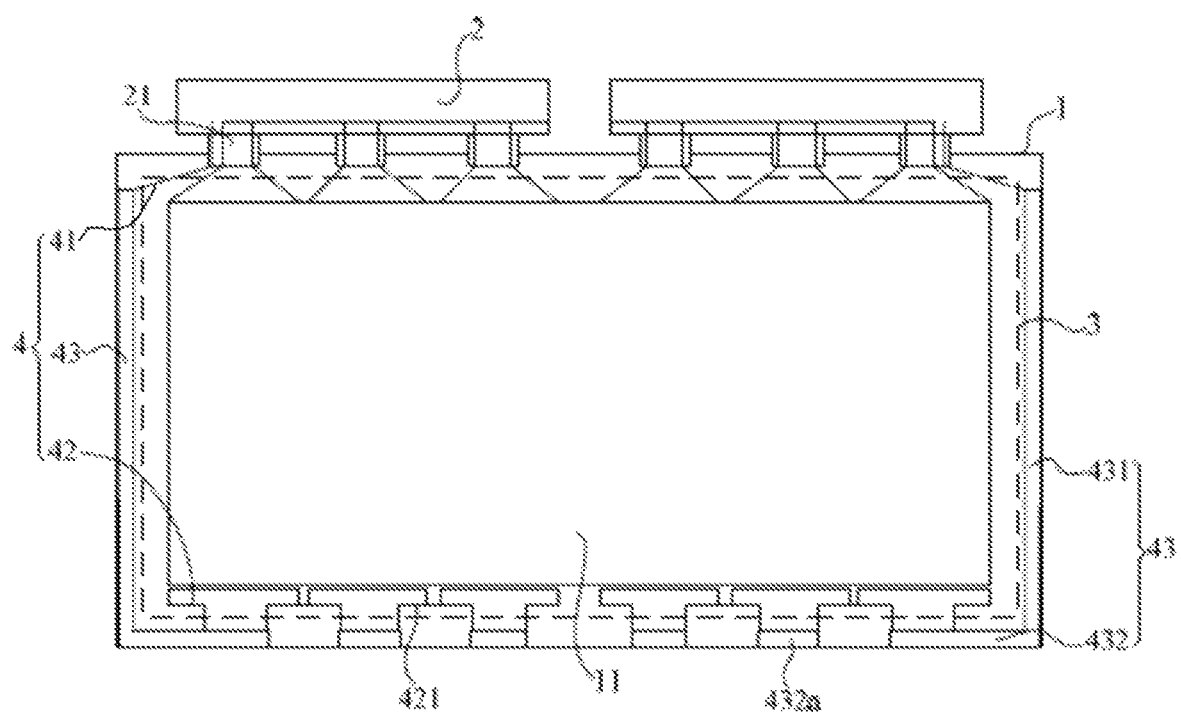
FIG. 4 is a structural view of a liquid crystal display panel in FIG. 3.

In the embodiment of the present application, referring to FIGS. 3 and 4, the liquid crystal display panel comprises:

an array substrate 1 having first and second ends disposed opposite to each other in a vertical direction; the first end is provided with a plurality of package bodies 21 in a lateral direction, and a plurality of data lines extending in a vertical direction is led out of each of the package bodies 21;

a sealed plastic frame 3 disposed around the display region 11 on the array substrate 1; and a repair line 4 including a lead-out line 41, lead-in line 42, and a connecting line 43; the lead-out line 41 is in insulated connection with one end of the at least one of the data lines adjacent to the package body 21, the lead-in line 42 is in insulated connection with one end of the corresponding data line away from the package body 21, and both ends of the connecting line 43 are each electrically connected to the lead-out line 41 and the lead-in line 42; wherein, the connecting line 43 is located on a side of the sealed plastic frame 3 facing away from the display region 11.

It is understood that, referring to FIG. 4, the first end of the array substrate 1 is provided with a circuit board 2 extending in the lateral direction, the circuit board 2 is provided with the package body 21, and the circuit board 2 is used for controlling the turning on or off of the data lines led out from each of the package bodies 21; further, the sealed plastic frame 3 is a connection structure widely used in the field of liquid crystal display for fixing the array substrate 1 and the color film substrate 5, which disposed around the display region 11 of the array substrate 1, with one side abutting the upper side of the array substrate 1 and another side abutting the lower side of the color film substrate 5, so that after backlight (UV) illumination, curing is formed to achieve a reliable connection between both. In the present embodiment, the first end is provided with two circuit boards 2 in a lateral direction, and a plurality of the package bodies 21 are respectively disposed on the two circuit boards 2; the liquid crystal display panel comprises two repair lines 4 totally, the lead-out lines 41 of the two repair lines 4 respectively are in insulated connection with one end of the data line led out from one of the circuit boards 2 close to the package body 21, and the lead-in lines 42 are respectively in insulated connection with one end of the corresponding data line away from the package body 21, i.e., the two repair lines 4 are each responsible for the repair work of the data lines on one of the circuit boards 2, and the connecting lines 43 of the two repair lines 4 are respectively located on both sides of the display region 11 in a lateral direction.

Regarding the routing design of the repair line 4, referring to FIG. 4, taking the repair line 4 as an example, the lead line 41 and the lead-in line 42 thereof are respectively in insulated connection with the two ends of at least one of the data lines, and two ends of the connecting line 43 are electrically connected to the lead-out line 41 and the lead-in line 42 respectively, that is, the repair line 4 is connected across the two ends of the data lines. Thus, when the data line is working normally, since the lead-out line 41 and the lead-in line 42 are insulated from the connection of the data line, the current signal may not be transmitted through the repair line 4, but normally flows through the data line to transmit the signal to each pixel; then, once the data line spanned by the repair line 4 is broken, the technician fuses the insulated connection between the lead-out wire 41, the lead-in wire 42 and the data line to make it become a conductive connection; thus, after the current signal may not continue to be transmitted when passing through the disconnection of the data line, it may reach the other end of the data line through the repair line 4, and continue to be transmitted to the pixel downstream of the disconnection of the data line, thereby ensuring the normal operation of the liquid crystal display panel. It should be noted that the data line that the repair line 4 may repair is not limited to the data line in the display region 11, but also includes a data line between the display region 11 and the sealed plastic frame 3.

In the present embodiment, in order to ensure that each data line on the liquid crystal display panel may be repaired in the case of disconnection, lead-out line 41 and lead-in line 42 of each repair line 4 are in insulated connection with all data lines of corresponding circuit board 2. Thus, when any of the data lines is broken, the technician blows the insulated connection between the lead-out line 41 and the lead-in line 42 to complete the repair. It should be noted that, in the present embodiment, although there are only two repair lines 4, and each repair line 4 may repair one data line, that is, only two data lines may be repaired at the same time. However, the technical solution of the present application is not limited thereto, and in other embodiments, the liquid crystal display panel may also include three or even more repair lines 4 to cope with the situation where more data lines are simultaneously disconnected.

It is understood that the lead-out line 41 and the lead-in line 42 are respectively located at two ends of the array substrate 1, and the electrical connection is also required through the connecting line 43 therebetween. For the routing design of the connecting line 43, it is mainly necessary to consider the relative positional relationship between the connecting line 43 and the sealed plastic frame 3. Referring to FIG. 3, in the technical solution of the present application, the connecting wire 43 is disposed on the outer side of the sealed plastic frame 3 (the side facing away from the display region 11). Thus, the above arrangement enables the loading on the connecting line 43 to be smaller than those generated upon disposing the connecting line 43 on the inner side of the sealed plastic frame 3 (the connecting line 43 is located inside the sealed plastic frame 3, repair line loadinging=$\varepsilon 0 \varepsilon r A/d$, $\varepsilon r=3.5\sim7$; the connecting line 43 is located outside the sealed plastic frame 3, repair line loadinging=$\varepsilon 0 A/d$); compared with the case where the connecting line 43 is disposed at the bottom of the sealed plastic frame 3, the line width of the connecting line 43 may be reduced (the connecting line 43 must be grooved upon being at the bottom of the sealed plastic frame 3 for the backlight to pass through to make the sealed plastic frame 3 subject to the light curing, however, the grooved connecting line 43 is too thin, resulting in excessive impedance, so the line width must be increased). In other words, disposing the connecting line 43 on the outer side of the sealed plastic frame 3 reduces the loading on the connecting line 43 and reduces the line width of the connecting line 43, which may effectively meet the requirements of the liquid crystal display product for high resolution and narrow frame.

The repair line 4 of the technical solution of the present application includes a lead-out line 41, a lead-in line 42, and a connecting line 43. The lead-out line 41 and the lead-in line 42 are respectively in insulated connection with the two ends of the data line, and the connecting line 43 is used to connect the lead-out 41 line and the lead-in line 42, so that the repair line 4 becomes an alternative to the data line. Once the data line is disconnected, the technician only blows the insulated connection to turn on the connection between the repair line 4 and the data line, thereby realizing the transmission of the signal through the repair line 4 and maintaining the normal operation of the liquid crystal display panel. In addition, the technical solution of the present application emphasizes that the connecting line 43 is disposed on a side of the sealed plastic frame 3 facing away from the display region 11. In this way, on the one hand, the loading is avoided to be too large when the connecting line 43 is disposed inside the sealed plastic frame 3, and on the other hand, the line width is avoided to be too large when the connecting line 43 is disposed at the bottom of the sealed plastic frame 3, thereby meeting the requirements for high resolution and narrow frame of liquid crystal display products.

Referring to FIG. 4, it is easy to understand that other structures are not additionally required to be installed between the connecting line 43 and the sealed plastic frame 3, and leaving a gap between the two will only increase the overall width of the liquid crystal display panel. Therefore, in the present embodiment, the connecting line 43 is disposed flush with the side of the sealed plastic frame 3 facing away from the display region 11. Similarly, in the present embodiment, the connecting line 43 is also disposed flush with the outer edge of the array substrate 1 to prevent a gap between the connecting line 43 and the outer edge of the array substrate 1, resulting in waste on the used area of the array substrate 1, i.e., waste on the structure of the array substrate 1.

In the present embodiment, the line width of the connecting line 43 is 150 μm to 350 μm. It is understood that the line width of the connecting line 43 is too large, as described above, which will undoubtedly cause the frame of the liquid crystal display panel to be too large to meet the requirement for the narrow frame of the liquid crystal display product; and when the line width of the connecting line 43 is too small, the impedance of the connecting line 43 is too large, which easily affects the resolution of the liquid crystal display panel. For example, but not limited to, 43-inch full HD (FHD), the line width of the connecting line 43 is preferably 250 μm. It should be noted that the present design is not limited thereto. In other embodiments, for certain liquid crystal display panels with special sizes, the line width of the connecting line 43 may also be less than 150 μm or greater than 350 μm.

As shown above, the connecting lines 43 of the two repairing lines 4 are respectively disposed on two sides of the display region 11 in the lateral direction, that is, respectively disposed flush with both sides of the sealed plastic frame 3 in the horizontal direction. However, the technical solution of the present application is not limited thereto. In the present embodiment, in order to shorten the line length of the lead-in line 42 and to facilitate achieving the insulated connection between the end of the data line away from the package body 21 and the repair line 4, the connecting line 43 is extended to be flush with the side of the sealed plastic frame 3 vertically away from the package body 21; each of the connecting lines 43 includes a vertical connecting line 431 and a horizontal connecting line 432 connected to each other, one end of the vertical connecting line 431 away from the horizontal connecting line 432 being electrically connected to the lead-out line 41 and the horizontal connecting line 432 being electrically connected to the lead-in line 42. In this way, the connecting lines 43 of the two repairing wires 4 are disposed close to the other three sides surrounding the sealed plastic frame 3 except for the package body 21, which greatly reduces the difficulty in connecting the data lines with the repair lines 4. It should be noted that the present design is not limited thereto. In other embodiments, regardless of the complexity of the design of the lead-out line 41, the connecting line 43 only includes the vertical connecting line 431, that is, the connecting lines 43 of the two repairing wires 4 are disposed only flush with two sides of the sealed plastic frame 3 in the lateral direction.

In the present embodiment, referring to FIG. 4, taking the repair line 4 as an example, the specific design of the insulated connection between the lead-out line 41 and the end of each data line close to the package body 21 is as follows: after the lead-out line 41 is led out from the one end of the vertical connecting line 431 away from the horizontal connecting line 432, the number of the package bodies 21 corresponding to the circuit board 2 is branched into multiple groups, and after each group enters the corresponding package body 21, correspondingly, the number of data lines led out from the package body 21 is branched into a plurality of sections, which passes through the package body 21, finally, an insulated connection between the lead-out lines 41 and each of the data lines is achieved. In addition, it should be noted that, in order to facilitate the technician to perform the conductive processing of the corresponding lead-out line 41 when the data line is disconnected, in the present embodiment, the insulated connection between the lead-out line 41 and the data line is disposed near the outer edge of the display region 11, that is, directly exposed on the array substrate 1, then, the technician may directly fuse it. Of course, in other embodiments, the insulated connection between the lead-out line 41 and the data line may also be specifically disposed at other positions, and the present design is not limited thereto.

In addition, in the present embodiment, the specific design for the horizontal connecting line 432 and the lead-in line 42 is: the horizontal connecting line 432 includes a plurality of horizontal connecting sections 432a spaced apart from each other, and the horizontal connecting sections 432a are disposed in one-to-one correspondence with the package body 21; the lead-in line 42 includes a plurality of lead-in sections 421 spaced apart from each other, and the lead-in sections 421 are correspondingly disposed with an interval between any two adjacent package bodies 21; any two adjacent horizontal connecting sections 432a are connected by one lead-in section 421. It is understood that, as such, the corresponding relationship between the repair line 4 and each data line is more clear, which is advantageous for reducing the length of the horizontal connecting line 432 and the lead-in line 42, then reducing the material cost of the repair line 4, thereby reducing the manufacturing cost of the entire liquid crystal display panel. Based on the arrangement for the lead-out line 41, similarly, in the present embodiment, the insulated connection between the lead-in line 42 and the data line is also disposed near the outer edge of the display region 11, that is, directly exposed on the array substrate 1, then, the technician may directly fuse it. Of course, in other embodiments, the insulated connection between the lead-in line 42 and the data line may also be specifically disposed at other positions, and the present design is not limited thereto.

Without loss of generality, the lead-out line 41, the lead-in line 42 and the connecting line 43 are all made of the same metal material; it is understood that, as such, when the repair line 4 is repaired, it is advantageous to maintain the stability of signal transmission. For example, without limitation, the lead-out line 41, the lead-in line 42, and the connecting line 43 are made of copper. It is understood that the copper material is widely used in the data line of the liquid crystal display field in the current art, which is advantageous for realizing high resolution of the liquid crystal display product. Of course, in other embodiments, the lead-out line 41, the lead-in line 42, and the connecting line 43 may also be made of aluminum. In addition, it should be noted that the present design is not limited thereto, and in other embodiments, the lead-out line 41 and the lead-in line 42 may also be made of a first metal material, and the connecting wire 43 is made of a second metal material. Specifically, the first metal material is molybdenum or titanium, and the second metal material is aluminum.

The present application further provides a liquid crystal display device comprising a liquid crystal display panel. The specific structure of the liquid crystal display panel is described in the above embodiments. Since this liquid crystal display device adopts all the technical solutions of all the above embodiments, it has at least all the beneficial effects brought about by the technical solutions of the above embodiments, and details are not described herein again The above mentioned is only the preferred embodiment of the present application, which does not limit the patent scope of the present application, and any equivalent structure or process made under the concepts of the present application by using the specification and the drawings of the present application or direct or indirect applications in other related technical fields should be contained in the scope of patent protection in a similar way.

The invention claimed is:

1. A liquid crystal display panel, wherein the liquid crystal display panel comprises:
    an array substrate having first and second ends disposed opposite to each other in a vertical direction; the first end is provided with a plurality of package bodies in a lateral direction, and a plurality of data lines extending in a vertical direction is led out of each of the package bodies;
    a sealed plastic frame disposed around the display region on the array substrate; and a repair line including a lead-out line, lead-in line, and a connecting line; the lead-out line is in insulated connection with one end of the at least one of the data lines adjacent to the package body, the lead-in line is in insulated connection with one end of the corresponding data line away from the package body, and both ends of the connecting line are each electrically connected to the lead-out line and the lead-in line; wherein,
    the connecting line is located on a side of the sealed plastic frame facing away from the display region; the connecting line includes a vertical connecting line and a horizontal connecting line connected to each other, one end of the vertical connecting line away from the horizontal connecting line being electrically connected to the lead-out line and the horizontal connecting line being electrically connected to the lead-in line; and the horizontal connecting line includes a plurality of horizontal connecting sections spaced apart from each other, and the horizontal connecting sections are disposed in one-to-one correspondence with the package body; the lead-in line includes a plurality of lead-in sections spaced apart from each other, and the lead-in sections are correspondingly disposed with an interval between any two adjacent package bodies;

any two adjacent horizontal connecting sections are connected by one lead-in section.

2. The liquid crystal display panel according to claim 1, wherein the connecting line is disposed flush with a side of the sealed plastic frame facing away from the display region.

3. The liquid crystal display panel according to claim 1, wherein the connecting line is disposed flush with an outer edge of the array substrate.

4. The liquid crystal display panel according to claim 1, wherein the line width of the connecting line is 150 μm to 350 μm.

5. The liquid crystal display panel according to claim 4, wherein the line width of the connecting line is 250 μm.

6. The liquid crystal display panel according to claim 1, wherein the lead-out line passes through at least one of the package bodies from the one end of the vertical connecting line away from the horizontal connecting line, and is in insulated connection with a corresponding data line.

7. The liquid crystal display panel according to claim 1, wherein the position where the lead-out wire is in insulated connection with the data line is disposed near the outer edge of the display region.

8. The liquid crystal display panel according to claim 1, wherein the position where the lead-in wire is in insulated connection with the data line is disposed near the outer edge of the display region.

9. The liquid crystal display panel according to claim 1, wherein the liquid crystal display panel further comprises another repair line, and the connecting lines of two of the repair lines are respectively located on both sides of the display region in the lateral direction;

the first end is provided with two circuit boards in a lateral direction, a plurality of the package bodies are respectively disposed on the two circuit boards, the lead-out lines of two of the repair lines respectively pass through the respective package body on one of the circuit boards and are in insulated connection with one end of the corresponding data lines close to the package body, and the lead-in lines of two of the repair lines are respectively in insulated connection with one end of the corresponding data line away from the package body.

10. The liquid crystal display panel according to claim 1, wherein the lead-out line, the lead-in line and the connecting line are all made of the same metal material; or the lead-out line and the lead-in line are made of a first metal material, and the connecting line is made of a second metal material.

11. The liquid crystal display panel according to claim 10, wherein the first metal material is molybdenum or titanium, and the second metal material is aluminum.

12. A liquid crystal display panel, wherein the liquid crystal display panel comprises:

an array substrate having first and second ends disposed opposite to each other in a vertical direction; the first end is provided with a plurality of package bodies in a lateral direction, and a plurality of data lines extending in a vertical direction is led out of each of the package bodies;

a sealed plastic frame disposed around the display region on the array substrate; and a repair line including a lead-out line, lead-in line, and a connecting line; the lead-out line is in insulated connection with one end of the at least one of the data lines adjacent to the package body, the lead-in line is in insulated connection with one end of the corresponding data line away from the package body, and both ends of the connecting line are each electrically connected to the lead-out line and the lead-in line; wherein, the connecting line is located on a side of the sealed plastic frame facing away from the display region;

one side of the connecting line is disposed flush with a side of the sealed plastic frame facing away from the display region, and the other side is disposed flush with an outer edge of the array substrate; the connecting line includes a vertical connecting line and a horizontal connecting line connected to each other, one end of the vertical connecting line away from the horizontal connecting line being electrically connected to the lead-out line and the horizontal connecting line being electrically connected to the lead-in line; and the horizontal connecting line includes a plurality of horizontal connecting sections spaced apart from each other, and the horizontal connecting sections are disposed in one-to-one correspondence with the package body; the lead-in line includes a plurality of lead-in sections spaced apart from each other, and the lead-in sections are correspondingly disposed with an interval between any two adjacent package bodies;

any two adjacent horizontal connecting sections are connected by one lead-in section.

13. A liquid crystal display device, wherein the liquid crystal display device comprises a liquid crystal display panel including:

an array substrate having first and second ends disposed opposite to each other in a vertical direction; the first end is provided with a plurality of package bodies in a lateral direction, and a plurality of data lines extending in a vertical direction is led out of each of the package bodies;

a sealed plastic frame disposed around the display region on the array substrate; and a repair line including a lead-out line, lead-in line, and a connecting line; the lead-out line is in insulated connection with one end of the at least one of the data lines adjacent to the package body, the lead-in line is in insulated connection with one end of the corresponding data line away from the package body, and both ends of the connecting line are each electrically connected to the lead-out line and the lead-in line; wherein, the connecting line is located on a side of the sealed plastic frame facing away from the display region; the connecting line includes a vertical connecting line and a horizontal connecting line connected to each other, one end of the vertical connecting line away from the horizontal connecting line being electrically connected to the lead-out line and the horizontal connecting line being electrically connected to the lead-in line;

the horizontal connecting line includes a plurality of horizontal connecting sections spaced apart from each other, and the horizontal connecting sections are disposed in one-to-one correspondence with the package body; the lead-in line includes a plurality of lead-in sections spaced apart from each other, and the lead-in sections are correspondingly disposed with an interval between any two adjacent package bodies;

any two adjacent horizontal connecting sections are connected by one lead-in section.

14. The liquid crystal display device according to claim 13, wherein the connecting line is disposed flush with a side of the sealed plastic frame facing away from the display region.

15. The liquid crystal display device according to claim 13, wherein the connecting line is disposed flush with an outer edge of the array substrate.

16. The liquid crystal display device according to claim 13, wherein the line width of the connecting line is 150 μm to 350 μm.

* * * * *